United States Patent [19]
Suzuki et al.

[11] Patent Number: 5,911,856
[45] Date of Patent: Jun. 15, 1999

[54] METHOD FOR FORMING THIN FILM

[75] Inventors: Yasuyuki Suzuki, Yokohama; Kenji Ando; Ryuji Biro, both of Kawasaki, all of Japan

[73] Assignee: Canon Kabushiki Kaisha, Tokyo, Japan

[21] Appl. No.: 08/665,770

[22] Filed: Jun. 18, 1996

Related U.S. Application Data

[63] Continuation of application No. 08/297,818, Aug. 30, 1994, abandoned.

[30] Foreign Application Priority Data

Sep. 3, 1993  [JP]  Japan ................................ 5-242186
Sep. 3, 1993  [JP]  Japan ................................ 5-242188

[51] Int. Cl.[6] .......................... C23C 14/34; C23C 14/54
[52] U.S. Cl. ............................. 204/192.13; 204/192.26; 204/192.27; 204/298.03
[58] Field of Search ..................... 204/192.12, 192.13, 204/192.15, 192.11, 192.22, 192.23, 192.26, 192.27, 192.28, 298.03, 298.07

[56] References Cited

U.S. PATENT DOCUMENTS

| | | | |
|---|---|---|---|
| 3,907,660 | 9/1975 | Gillery ............................... | 204/192.15 |
| 4,125,446 | 11/1978 | Hartsough et al. ................. | 204/192.29 |
| 4,172,020 | 10/1979 | Tison et al. ........................ | 204/192.13 |
| 4,311,725 | 1/1982 | Holland .............................. | 204/192.13 |
| 4,407,709 | 10/1983 | Enjouji et al. ..................... | 204/192.13 |
| 4,421,622 | 12/1983 | Hollars .............................. | 204/298.07 |
| 4,533,449 | 8/1985 | Levenstein ......................... | 204/298.03 |
| 4,560,576 | 12/1985 | Lewis et al. ....................... | 204/192.26 |
| 4,793,908 | 12/1988 | Scott et al. ........................ | 204/192.15 |
| 4,824,546 | 4/1989 | Ohmi .................................. | 204/192.12 |
| 4,849,081 | 7/1989 | Ross ................................... | 204/192.15 |
| 5,135,581 | 8/1992 | Tran et al. ........................ | 204/298.07 |
| 5,221,636 | 6/1993 | Landreau et al. .................. | 204/298.03 |

OTHER PUBLICATIONS

Pitt et al. "Automatic monitoring of deposition conditions during rf sputtering of dielectric materials" Vacuum vol. 25, No. 6 1975 Pergamon Press Ltd. pp. 265–271.

*Primary Examiner*—Nam Nguyen
*Assistant Examiner*—Rodney G. McDonald
*Attorney, Agent, or Firm*—Fitzpatrick, Cella, Harper & Scinto

[57] ABSTRACT

In a method for forming a multi-layer optical thin film on a surface of a base material, a multi-layer optical thin film is formed based on thickness setting values for respective layers, an optical characteristic of the thus formed multi-layer optical thin film is measured, thicknesses for the respective layers for a multi-layer optical thin film to have an aimed optical characteristic are obtained based on the thus measured optical characteristic, the thickness setting values are corrected based on the thus obtained film thicknesses for the respective layers, and a next multi-layer optical thin film is formed based on the thus corrected thickness setting values. In another method for forming a thin film by sputtering, a concentration of $H_2O$ gas in a vacuum chamber or a discharge impedance is measured, and at least one of sputter power, sputter gas partial pressure, and sputter gas flow rate is controlled in accordance with the measurement result so as to keep the sputtering rate constant.

4 Claims, 7 Drawing Sheets

METHOD FOR FORMING THIN FILM

This application is a continuation of application Ser. No. 08/297,818 filed Aug. 30, 1994, which is now abandoned.

BACKGROUND OF THE INVENTION

1. Field of the Invention

The present invention relates to methods and apparatus which can form a desired thin film such as a multi-layer optical thin film, an oxide thin film, etc., on a surface of any of various base materials, with good reproducibility.

2. Related Background Art

In conventional methods, conditions for obtaining a desired characteristic are determined, before formation of optical thin films by a trial and error procedure in which a film is formed on a monitor substrate that is identical to the base material on which the desired thin film is to be formed, an optical characteristic of the monitor substrate is measured by a spectrophotometer or the like, and computer simulation is conducted based on the results of the measurement. Further, the film formation on the monitor substrate and the measurement of the optical characteristic are periodically repeated carried out to check for change in the characteristic. If there is some change in the characteristic, calibration of the conditions is again performed to form a multi-layer optical thin film with the desired optical characteristic. Particularly in cases of film formation requiring high-accuracy thickness control, as in forming an optical thin film, the monitor substrate is set at a position where the film is formed in a thickness nearly equal to that on the production substrate and, monitoring the thickness of the film by optically measuring the thickness of the film deposited on the monitor substrate, the thickness of the film deposited on the production substrate is controlled. Available methods for monitoring the film thickness include use of a quartz oscillator film thickness monitor which can also measure the thickness of opaque films, and a method for monitoring the rate and thickness by discharge spectral analysis of the film materials, as well as the above optical means.

For forming a thin film by sputtering, the sputtering rate is arranged to be kept stable by keeping constant parameters associated with the sputtering rate, e.g., by monitoring an ultimate pressure before film formation, controlling purity or a flow rate of introduced gas, monitoring the sputter power, controlling the purity of the target, controlling the temperature or flow rate of cooling water, etc.

Thin film formation utilizing the sputtering phenomenon (hereinafter referred to as sputtering) is widely utilized because the film can be relatively easily formed with high-melting-point materials or compounds not suitable for vapor deposition, and because the film can be readily formed over a large area. In such sputtering, heating (baking) of the vacuum chamber is normally conducted to reduce the amount of gas released during sputtering from the walls of the vacuum chamber and other components, in order to improve the uniformity of the film and the efficiency of the film formation. Apparatus for performing such sputtering employ, instead of the conventional batch processing, a method for suppressing the release of gas during sputtering so as to improve the quality of the vacuum in the vacuum chamber, as in single-wafer-processing sputtering apparatus, inline sputtering apparatus, etc. provided with a prechamber (load-lock chamber).

General methods for producing an oxide thin film utilizing plasma are the sputtering method, the vapor growth (CVD) method, and the ion plating method. However, if these methods are used to produce a normal thin film, a composition ratio of the film is affected because of insufficient oxidation of the thin film, or because of atoms being deposited without being perfectly bound in the film. They could be a cause of optical absorption. When such optical absorption occurs in the thin film, the transmittance is decreased for an anti-reflection coating formed of the thin film, or the reflectivity is decreased for a high-reflection film, whereby the desired functions of the optical thin film are lost. The tendency for this to happen increases as the wavelength of the employed light decreases. Also, the absorption of light heats an absorbing portion, which could damage the film itself or distort the ground substrate, lowering surface accuracy. Therefore, the optical absorption must be reduced as much as possible. Conventionally, the substrate has been heated during or after the film formation to promote oxidation on the substrate and to get rid of unbonded atoms.

SUMMARY OF THE INVENTION

The method for setting the conditions using the monitor substrate, however, has the following problems, because the check of a characteristic for obtaining an optical thin film with a desired, stable characteristic must be periodically performed using a monitor substrate. (1) lowered productivity because an operator needs to optimize the film formation conditions with necessity with a change in optical characteristic; (2) some inevitable variations in the desired characteristic of the products because optimization of the characteristic is not easy; (3) considerable expenditure of labor and time because the operator needs to measure a temporal change in the characteristic being monitored; (4) lowered availability factor in the case of the load-lock production method, in which a film-forming chamber is always kept in vacuum to stabilize the characteristic, because the film-forming chamber must be open to the air to exchange monitor substrates; (5) increased production cost because the film thickness monitor is expensive.

In the case of the film thickness being optically monitored, there are some restrictions on the monitor mounting position, so that the monitor can not always be mounted at a position where the film is obtained with a thickness equivalent to that on the substrate, which can cause a lower accuracy of thickness control. Another problem is that the thickness cannot be monitored for an opaque film when using optical monitoring.

The quartz oscillator thickness monitor can monitor the thickness of an opaque film, which is impossible to do with the above described optical thickness monitor, and it can provide a monitor mounting position with a relatively high degree of freedom, thus being better in operability than the optical monitor. The quartz oscillator is, however, expensive. Once dust or the like is attached to the monitor, the monitor indicates an abnormal thickness, which disables the stable thickness control, thus presenting problems of insufficient accuracy and stability as the thickness monitor.

On the other hand, if the thickness monitor is not used in the sputtering method, a problem of poor reproducibility of the film thickness is experienced due to an unstable sputtering rate. A reason for this is as follows. Gas discharge is utilized in performing sputtering. The discharge forms charged particles such as ions, electrons, etc., and radicals, which heat or sputter the chamber inner walls, the substrate, the substrate holder, etc., causing a gas to be released, rendering the atmosphere on the sputtering chamber impure. Residual gas components in the gas would vary, which is also a cause. Also, as the sputtering progresses, the temperature of the target changes, the shape of the target changes because of erosion, and the discharge impedance changes when forming a highly insulating film, because of deposition thereof onto the chamber inner walls, causing the self bias voltage or the plasma density to change, which cause a change in the sputtering rate.

In view of the problems in the above-described conventional technology, an object of the present invention is to provide methods and apparatus for forming a thin film which can make it easier to optimize film-forming conditions and in to monitor for temporal changes in product quality, which can reduce variations of product quality, which can improve the production efficiency, and which can facilitate the control of a characteristic of an optical thin film. Another object is to stabilize the sputtering rate so as to enable one to perform higher-accuracy thickness control using only the film-forming time, without any need to monitor the film thickness.

To achieve the above objects, the present invention may be applied to formation of a multi-layer optical thin film, such as an anti-reflection film on a surface of a base, in which the film is formed based on thickness setting values for respective layers, an optical characteristic such as a reflection characteristic is measured for the film thus formed, thicknesses for respective layers are obtained based on the thus measured optical characteristic, so that the multi-layer optical thin film may have an optical characteristic, previously determined to be desired the thickness-setting values are corrected based on the obtained thicknesses for respective layers, and a next multi-layer optical thin film is formed based on the thus-corrected thickness setting values.

Here, initial thickness setting values are normally obtained at least based on the desired optical characteristic of the multi-layer optical thin film, the film-forming materials, and the number of layers. Also, the base is held by a holder having an outer shape almost the same as the base, a plurality of bases, each mounted in the holder, are set in a cassette, then a carrier holds one base through the holder to carry it out of the cassette and through sections in the apparatus, and it is then stored in the cassette.

For forming a thin film on a surface of a base in a vacuum chamber by the sputtering method, a concentration of $H_2O$ gas in the vacuum chamber is measured, at least one condition selected from the group consisting of sputter power, sputter gas partial pressure, and sputter gas flow rate is controlled in accordance with the thus measured concentration of $H_2O$ gas, so as to keep the sputtering rate constant, and the thickness of the thin film being formed is controlled by controlling the sputtering time. The concentration of $H_2O$ gas can be measured by the quadrupole mass spectrometer, the sector-type mass spectrometer, etc.

Further, in a case where a thin film is formed on a surface of a base by a sputtering method utilizing plasma generated by discharge in the vacuum chamber, the discharge impedance is measured, at least one of condition selected from the group consisting of sputter power, sputter gas partial pressure, and sputter gas flow rate is controlled in accordance with the thus-measured discharge impedance, so as to keep the sputtering rate constant, and the thickness of the thin film being formed is controlled by controlling the sputtering time. Preferably, a thin film of the same material as that for the thin film formed on the base, is formed on the inner walls of the vacuum chamber.

Since in the present invention the multi-layer optical thin film such as an anti-reflection film, is formed on the basis of thickness-setting values for respective layers, an optical characteristic such as the reflection is measured for the thus-formed multi-layer optical thin film, thicknesses for respective layers are obtained based on the thus-measured optical characteristic so that the multi-layer optical thin film may have a desired, predetermined optical characteristic, the thickness-setting values are corrected based on the thus obtained thicknesses for respective layers, and a next multi-layer optical thin film is formed based on the thus corrected thickness-setting values, the optimization of film-forming conditions (thicknesses for respective layers) can be readily automated, the optical thin film can be formed with high accuracy and excellent reproducibility and stability, and variations in product quality can be substantially reduced. Also, the temporal change of quality is automatically monitored to be corrected, whereby the optical thin film can be formed with a very high efficiency. Namely, condition isolation and condition correction to decrease the availability factor of apparatus can be reduced, thus decreasing the cost of film formation. Further, management of characteristics of obtained optical thin films can be made easier by storing the measurements of the optical characteristics.

On the other hand, in case of a thin film being formed by the sputtering method, the concentration of $H_2O$ gas in the vacuum chamber or the discharge impedance is measured and at least one of sputter power, sputter gas partial pressure, and sputter gas flow rate is controlled in accordance with the thus measured value so as to keep the sputtering rate constant, whereby high-accuracy thickness control can be achieved solely by controlling the film-forming time, without using a thickness monitor, thus reducing the cost of thin film formation and permitting continuously stable film formation for a long period of time. Also, abnormalities such as a leak in the vacuum chamber or an abnormality of a discharge circuit, can also be readily detected from the measurements of the concentration of $H_2O$ gas or the discharge impedance, thus improving the quality stability and reliability of the thin film.

Further, if the vacuum chamber is subject to an air leak for exchange of targets or for maintenance inside the vacuum chamber in case of the film formation requiring high-accuracy control of thickness and quality, such as formation of an optical thin film, by the above conventional sputtering apparatus, the walls of the vacuum chamber and others adsorb water in the air. After that, starting vacuum evacuation and film formation, desorption of water (released gas) from the walls of the vacuum chamber and other materials therein affects a change in the density of the film (index of refraction) and in the film-forming speed between the start of film formation and the time when no more gas is released in the vacuum chamber, which is disadvantageous. As a technique to decrease the influence of the released gas there is a method of effecting baking for a sufficient time, but it is not easy to increase the film formation efficiency by that method when performed in factory facilities.

Also, the abovedescribed conventional technology for heating the substrate gives rise to the following problems: (1) materials that can be used for the substrate are limited to heat-resistant materials; (2) the reliability of surface accuracy drops because of the possibility of distortion of the substrate surface; (3) the reliability is also lowered because of a need for heating and for slow cooling steps, which could raise the cost, lower the productivity, and make the manufacturing apparatus complex.

In view of the problems in the abovedescribed conventional technology, another object of the present invention is, therefore, to provide methods and apparatus for forming a thin film, which can keep the optical characteristic of the formed thin film and the film-forming speed stable for a long period of time, making it possible to obtain thin films with good reproducibility. Another object is to obtain superior thin films without a need to limit the materials for the substrate. A further object is to enhance the simplicity, productivity and reliability of technology.

To achieve the above objects, the present invention is characterized in that in forming a thin film in a vacuum chamber by sputtering, a partial pressure of $H_2O$ or $OH$ in the vacuum chamber is controlled to have a predetermined value, for example a value in the range of $1\times10^{-7}$ to $1\times10^{-3}$ Pa during the film formation.

In another aspect, in which plasma is produced in the vacuum chamber and an oxide thin film is formed on a substrate or the like utilizing the plasma, $H_2O$, $H_2O_2$, or a mixture thereof is forced into the vacuum chamber and high-frequency power of 30 to 300 MHz is applied to an arbitrary number of discharge electrodes set in the vacuum chamber. The oxide thin film is formed, for example, by such a sputtering method that rare (inert) gas as sputter gas and oxygen as reactive gas are is supplied into the vacuum chamber and discharge power is applied to a sputter target set in the vacuum chamber to start sputtering. A gas form is preferable for $H_2O$, $H_2O_2$, or the mixture thereof forced into the vacuum chamber. The oxide thin film is, for example, an $Al_2O_3$ film, a $HfO_2$ film, a $ZrO_2$ film, a $Y_2O_3$ film, a $Ta_2O_5$ film, or a $TiO_2$ film, or a mixture thereof.

In the case where the thin film is formed by sputtering, and immediately thereafter the vacuum chamber is subjected to an air leak in order to exchange targets, to perform maintenance inside the vacuum chamber, or the like, the water vapor adsorbed from the air is subsequently desorbed and released from the vacuum chamber and the surface of the substrate (because of the plasma heating or the like) at the initial stage of the next film formation, so that the partial pressure of water vapor inside the vacuum chamber increases. Namely, the desorbing, released gas is mainly composed of water. The released gas increases at the initial stage of film formation by the plasma heating or the like, and decreases gradually as the film-forming time and evacuation time elapse. Since the amount of the released gas changes with the passage of the film-forming time and the evacuation time, it affects the speed at which the thin film is formed and the quality of the film during sputtering. The present invention is directed at stabilizing the forming speed of the sputtering film and the quality of the film by controlling the partial pressure of water ($H_2O$) or $OH$ in the vacuum chamber and keeping that pressure at a certain specific value during the film formation.

When the oxide thin film is formed utilizing plasma by the sputtering method, the CVD method, or the ion plating method, the present invention employs high-frequency (hereinafter referred to as VHF) power of 30 MHz to 300 MHz applied to the discharge electrode, while introducing $H_2O$, $H_2O_2$, or the mixture thereof. The following describes reasons for using the VHF power rather than power below 30 MHz: (1) The density of plasma increases to further promote decomposition of introduced gas; (2) the spread of plasma increases in the vacuum chamber to broaden the region of reaction; and (3) the thickness of the sheath of plasma decreases so as to reduce damage to the substrate, caused by incident, charged particles. Also, reasons for introducing $H_2O$ or $H_2O_2$ are as follows: (1) Activated oxygen can be obtained by dissociation at low energy, as compared to the use of oxygen gas; and (2) hydrogen obtained by dissociation of $H_2O$ or $H_2O_2$ is combined with unbonded atoms to stabilize them. According to the present invention, $H_2O$ or $H_2O_2$ is thus decomposed with high efficiency by the VHF power to produce the activated oxygen and hydrogen, whereby the activated oxygen promotes oxidation of the thin film and the hydrogen removes defects in the film. Therefore, excellent oxide thin films, without optical absorption, can be formed without a need to heat the substrate.

BRIEF DESCRIPTION OF THE DRAWINGS

FIG. 2 is a block diagram of an apparatus for forming a multi-layer optical thin film according to the second embodiment of the present invention, which is arranged to automatically obtain all characteristic conditions, simply by input of a necessary optical characteristic, a used material, a number of layers, and so on;

DETAILED DESCRIPTION OF THE PREFERRED EMBODIMENTS

Embodiment 1

Figure 1:
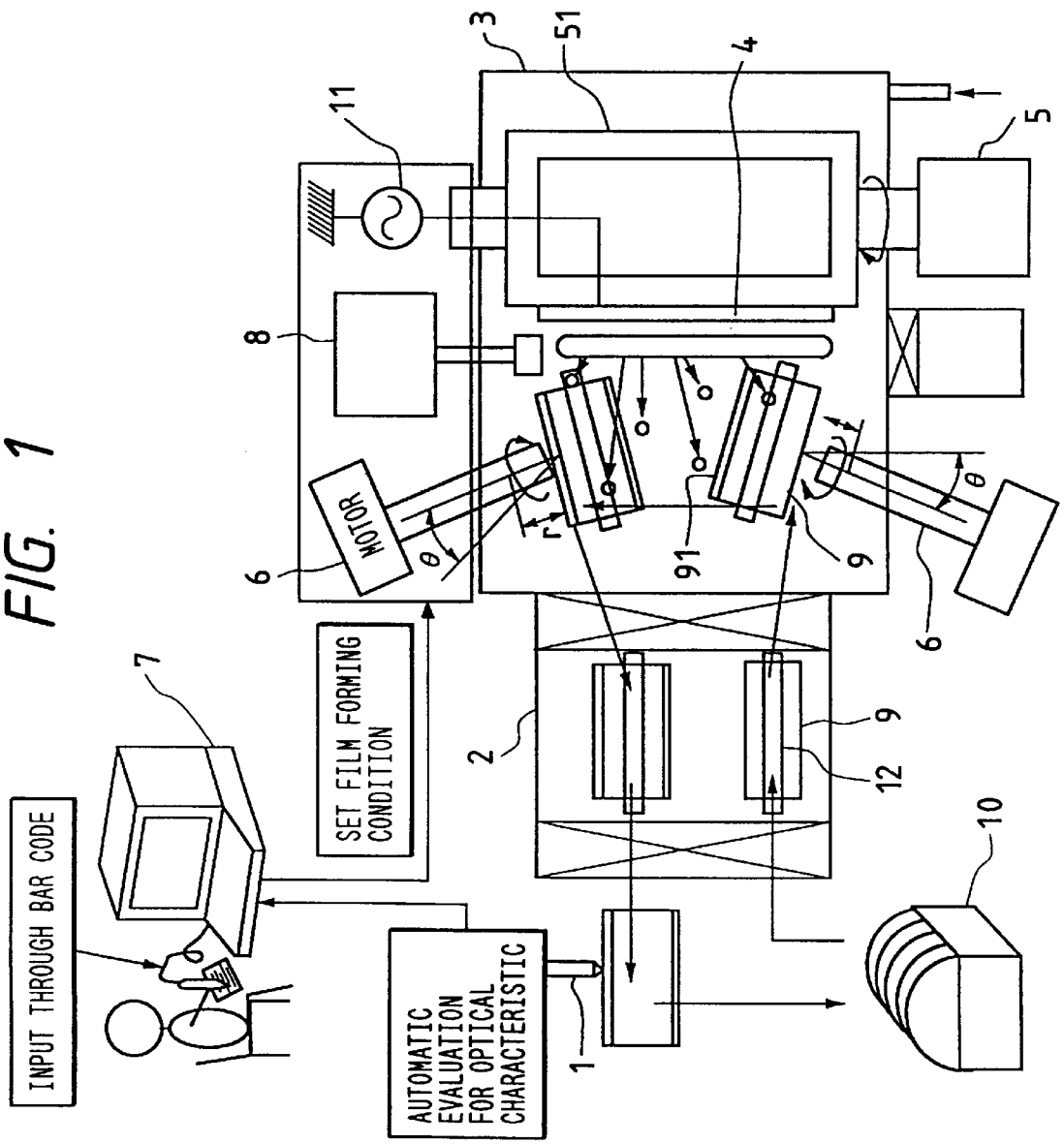
FIG. 1 is a block diagram of an apparatus for forming a multi-layer optical thin film according to the first embodiment of the present invention, which is arranged to form a stable optical thin film by setting film-forming conditions.

FIG. 1 is a block diagram to show an apparatus for forming a multi-layer optical thin film by the sputtering method in accordance with the first embodiment of the present invention, indicating the features of the present invention best. In FIG. 1, reference numeral 1 designates an apparatus for measuring an optical characteristic of a thin film, 2 designates a load-lock chamber, 3 designates a film-forming chamber, 4 designates a sputter target, 51 designates a rotary member on which a plurality of sputter targets 4 are mounted, 5 designates a target switching motor for rotating the rotary member 51 to switch the sputter targets from one to another, 9 designates substrates, 91 designates a thin film formed on a substrate 9, 6 designates a substrate position controller for controlling the position of substrate 9 while holding the substrate 9 at a sputter position, 7 designates a computer for executing calculation processing, data management, drive control of the apparatus, etc., 8 designates a quartz-oscillator-type film thickness monitor, 12 designates a substrate holder having an outer shape identical with the substrate 9, 10 designates a cassette for storing substrates each set in the substrate holder 12, and 11 designates an RF generator for applying a high-frequency (RF) voltage to the target 4. This apparatus is so arranged that a plurality of targets 4 are mounted on the rotary member 51 in parallel with the rotational shaft thereof, and the target switching motor 5 switches the targets 4 from one to another so as to be opposed to the substrate 9.

Using the apparatus as so arranged, and following the procedures described below, under control of computer 7 an optical thin film is formed in a multi-layer structure or in a single-layer structure under optimum film-forming conditions on either one of various types of substrates registered in the computer 7.

(1) First, a substrate holder 12, stored in the cassette 10 and holding a cleaned substrate, is carried into the load-lock chamber 2, and the load-lock chamber 2 is pre-evacuated.

(2) After completion of the pre-evacuation, the substrate 9 is moved into the film-forming chamber 3 to be set on the substrate position controller 6.

(3) Next, an optical thin film is formed by sputtering under predetermined film-forming conditions on the substrate 9 set on the substrate position controller 6. Switching the targets 4, plural kinds of materials can accordingly be sputtered. An optical film can be formed in an arbitrary number of layers, using different kinds of materials. Employing two substrate position controllers 6, two substrates can be simultaneously subjected to the film formation; or after film formation on the top surface of a substrate, the back surface can be continuously subjected to the film formation. The time for stopping each sputtering operation can be determined by detecting a film thickness of preset thickness data by means of the thickness monitor 8. It is contemplated that a shutter is set between a substrate and a target so as to form optical thin films different in characteristic on two substrates simultaneously subjected to the sputtering. Although this example is arranged to form films on the top surface and the back surface on a continuous basis, the sputtering may be carried out substrate by substrate, or only on one side without any inconvenience to take advantage of the features of the present invention.

(4) After completion of the film formation, the substrate 9 is carried through the load-lock chamber 2 into the air, and then a characteristic of the optical thin film formed on the substrate 9 is measured using the measuring device 1. A temporal change of the characteristic can also be checked on this occasion. The measuring device 1 sends the results of the optical characteristic measurement step (obtained after the characteristic becomes stable) to the computer 7.

(5) Based on the results, the computer 7 calculates the thickness of each layer in the multi-layer optical thin film. If there is a deviation between a calculated thickness and the corresponding design value, the computer 7 automatically corrects the thickness setting values in the film-forming conditions the a next substrate of the same kind. More specifically, since the present apparatus employs the thickness monitor 8, the computer rewrites the setting values of the thickness data in the thickness monitor 8. In the case where the setting conditions of sputtering stop are based on the film-forming time, the film-forming time is rewritten. If there is an abnormality in measurement results, the apparatus may be so arranged as to provide a warning and to be stopped. Storing the measurement results can be effective to check a temporal change in characteristic of a same substrate, or to use the results as data for checking past characteristics, which facilitates the management of characteristics of components such as lenses.

As described above, the apparatus based on the present invention can automatically correct a change in characteristic caused by a change of erosion of target or by drying of the film-forming chamber. As so arranged, there is no need to perform an analysis based on isolation of conditions when a change appears in the characteristic, which can be waste of labor and time, and stable optical thin films can be always formed with good reproducibility.

Embodiment 2

Figure 2:
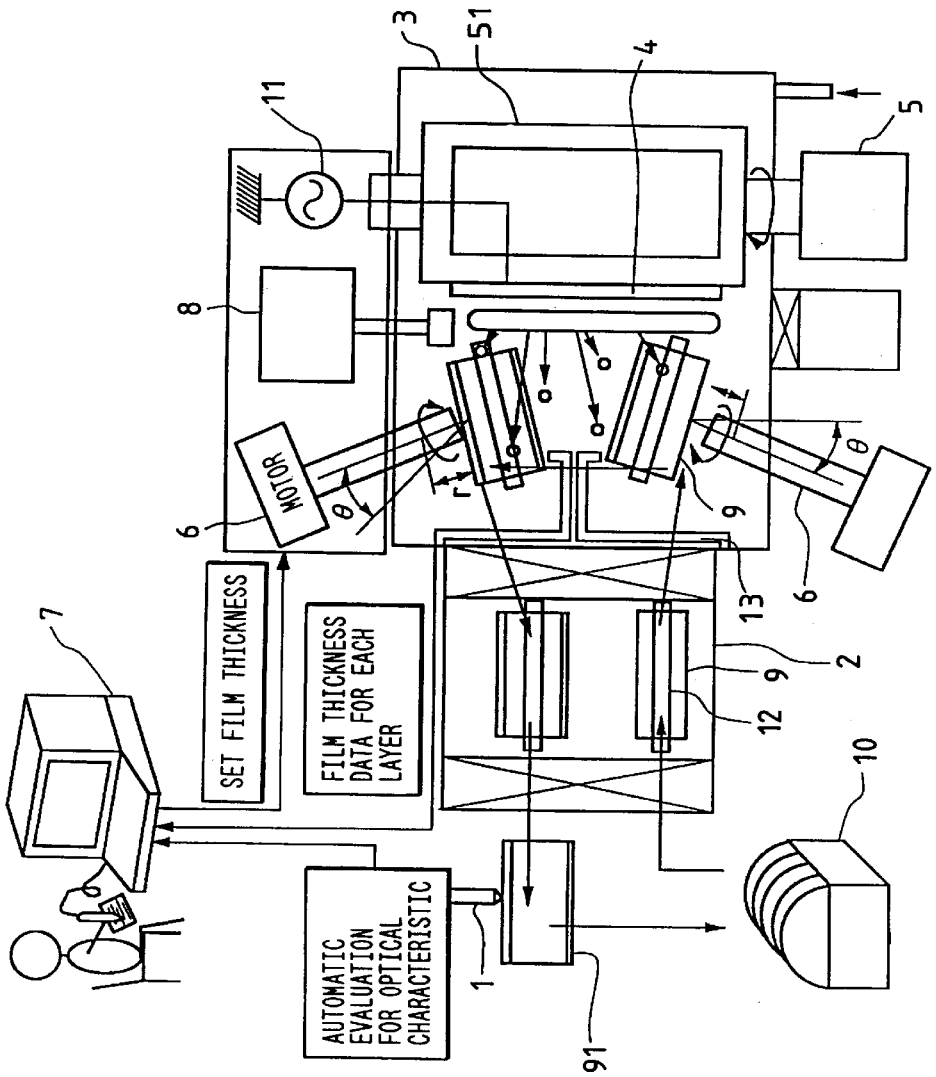

FIG. 2 is a block diagram to show an apparatus for forming a multi-layer optical thin film in accordance with the second embodiment of the present invention. This apparatus is so arranged that the structure of a film is automatically determined through input of an aimed-for (desired) optical characteristic, the number of layers, materials, etc.; all conditions are automatically determined by measuring the characteristic during film formation; and thus optical components can be produced without a defect. This apparatus is further provided with a device 13 for measuring the characteristic of an optical thin film formed on the substrate 9 while the substrate 9 is on the substrate position controller 6.

Using this apparatus, an operator first puts basic data such as an aimed optical characteristic, a number of layers, materials, etc. into the computer 7. Based on the input values, the computer 7 designs a thin film and determines film-forming conditions. Based on the determined conditions, a thin film is formed on a monitor substrate 9 in the same manner as in the previous embodiment. During the formation the device 13 measures the characteristic during every formation of a layer. If the thickness of a film of a material now under formation has not yet reached the set characteristic, an additional amount is determined to continue additional film formation. At the same time, the initial thickness setting values are also rewritten, so that the next film formation can be executed based on the rewritten data. If the a thickness of a certain layer exceeds the set value, thicknesses of subsequent layers are recalculated so as to satisfy the desired characteristic as a whole, and the setting values for subsequent layers are renewed. Repeating the above processes, a thin film is formed that finally reaches the desired characteristic. If an intermediate layer becomes too thick to correct the characteristic, the film formation is then interrupted and that state is indicated. In that case, the machine is stopped, or another monitor substrate of the same kind is again taken into the apparatus to continue the determination.

Once the desired characteristic is obtained with the monitor substrate as described above, component processing is started under the conditions. In the component processing the film formation can be done while controlling every layer. However, the optical characteristic generally changes depending upon moisture absorption, so that one in vacuum is different from another in the air. Accordingly, the characteristic in vacuum must be set to allow for a change in the air. It is contemplated that another optical characteristic evaluating device is set in the air to perform final evaluation of characteristic of optical components using the characteristic in the air, and the evaluation results can be fed back to the set thicknesses.

Embodiment 3

Figure 3:
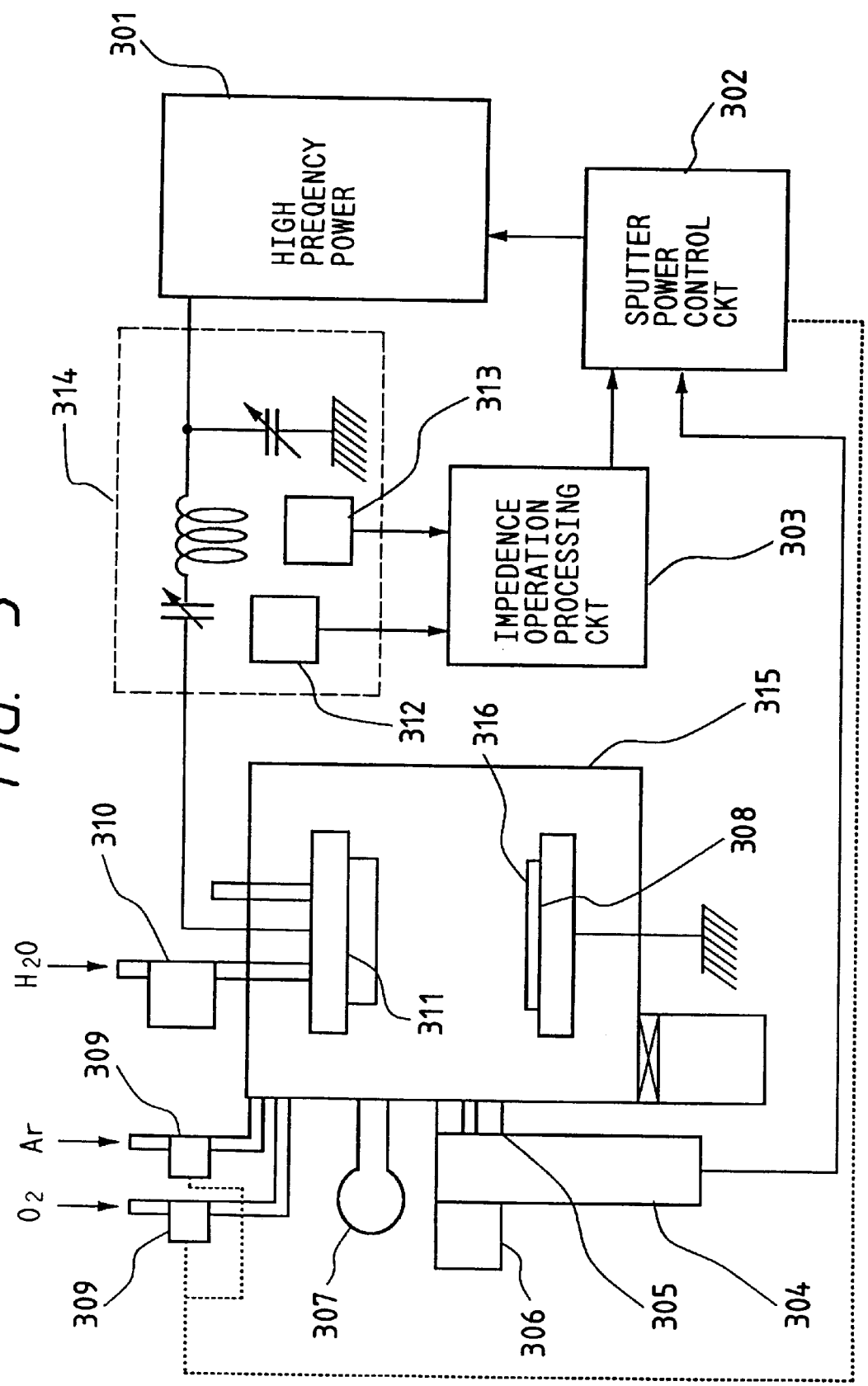
FIG. 3 is a block diagram of a thin-film forming apparatus according to the third embodiment of the present invention.

FIG. 3 is a block diagram to show a thin-film forming apparatus (high-frequency sputtering apparatus) according to the third embodiment of the present invention. In FIG. 3, reference numeral 315 designates a film-forming chamber (chamber), 311 an oxide sputter target of $SiO_2$, 301 a sputter power supply for applying RF power to the target 311, 302 a sputter power controlling circuit for controlling the sputter power supply 301 to control the power applied to the target 311, 312 and 313 matching capacitor changing motors, 303 an impedance calculating circuit, 304 a mass spectrometer for measuring a partial pressure of residual $H_2O$ in the film-forming chamber 315, 316 a substrate on which a thin film is to be formed, 308 a substrate holder for holding the substrate 316, and 309 gas mass flow meters for measuring a flow rate of Ar or $O_2$ introduced into the film-forming chamber 315.

Using the apparatus in this arrangement, a thin film of $SiO_2$ is formed on the substrate 316 while introducing Ar and $O_2$ as sputter gas and applying RF power to the target 311, which is next described.

First, the substrate 316 is carried into the film-forming chamber 315 to be set on the substrate holder 308. Although it is to be desired that in order to keep residual gas components stable in the film-forming chamber, the substrate is carried into the film-forming chamber 315 through a load-lock chamber or the like while the film-forming chamber is always maintained in vacuum, the present embodiment omits the load-lock chamber.

After the substrate 316 is carried into the film-forming chamber 315, the film-forming chamber 315 is evacuated to a predetermined degree of vacuum and then the sputter gas is introduced. Then the sputter power is applied to the target 311 to cause discharge, to sputter the target 311, and to form a thin film of $SiO_2$ on the substrate 316. As the sputtering is continued, gas, mainly comprised of $H_2O$, is released from the inner walls of the film-forming chamber 315, because of the plasma. The amount of gas released depends upon the materials of the film-forming chamber 315, the history thereof (evacuation time, baking time, temperature, etc.), the temperature of the film-forming chamber 315, etc., and it is difficult to keep the amount of the released gas always constant.

Figure 4:
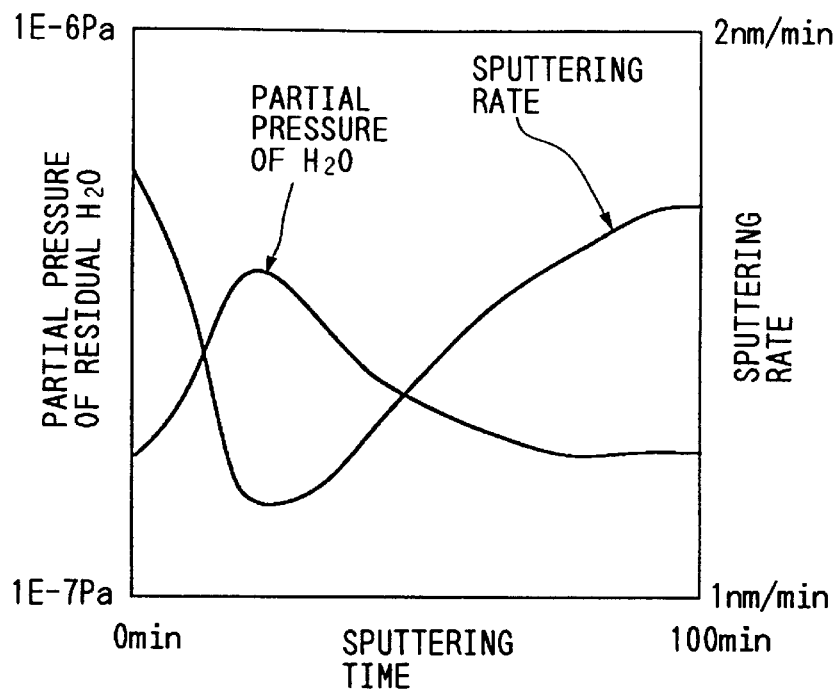
FIG. 4 is a graph of the relationship between the partial pressure of residual $H_2O$ in a film-forming chamber and the sputtering rate.

FIG. 4 is a graph to show a relation in time change between the partial pressure of residual $H_2O$ and the sputtering rate in the case where after evacuating inside the chamber up to $1\times10^{-3}$ Pa, the Ar gas was introduced at 200 sccm and the target 311 was sputtered with RF power of 1 kW and under discharge pressure of $5\times10^{-1}$ Pa. Immediately after the discharge the partial pressure of residual $H_2O$ gas increases while the sputtering rate decreases. This is because $H_2O$ is decomposed in the gas to increase partial pressures of atomic hydrogens, hydrogen radicals, hydrogen ions, OH radicals, oxygen, etc. in the discharge gas. Based on the results, the sputtering rate can be maintained constant even with an increase in the partial pressure of residual $H_2O$ gas by increasing the sputter power or by decreasing the flow amount of $O_2$ gas.

Figure 5:
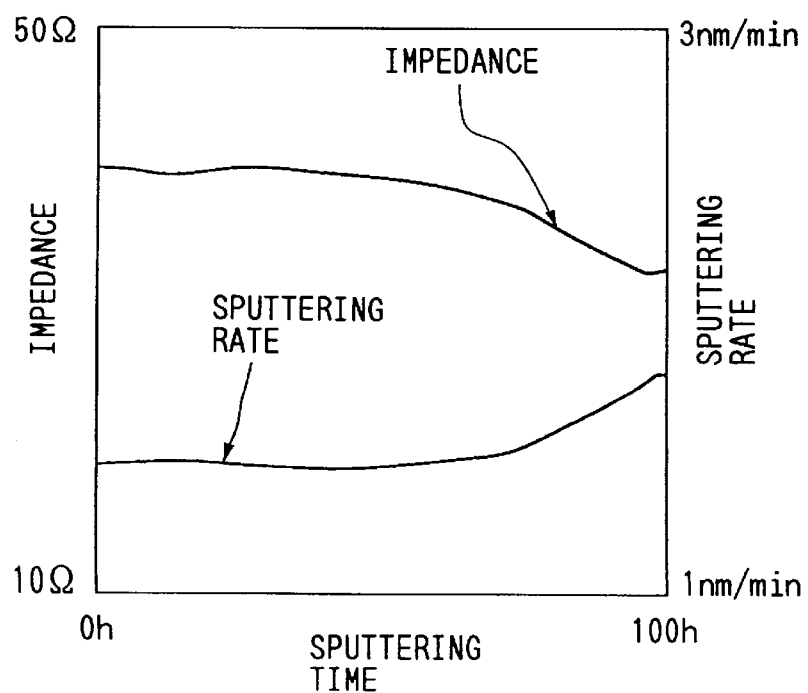
FIG. 5 is a graph of the relationship between the discharge impedance and the sputtering rate.

FIG. 5 is a graph to show a relation in time change between the sputtering rate and the discharge impedance in a continuously discharging state. The discharge impedance is measured in such a manner that capacitances of two variable condensers in a matching box 314 are read from rotational positions of the motors 312 and 313 and the impedance is calculated based on them. In case of dc discharge, the discharge impedance can be read from a discharge current and a target voltage. In FIG. 5, the sputtering rate increases as the discharge impedance decreases. This is because a change in the environment inside the film-forming chamber, for example coverage of the inner walls of the film-forming chamber 315 with an insulator film of $SiO_2$ or progress of erosion of the target 311, results in a decrease of the discharge impedance, which increases the density of the plasma. Accordingly, the sputtering rate can be maintained constant, even with a decrease in impedance, by decreasing the sputtering power or increasing the flow rate of $O_2$ gas.

The change in residual $H_2O$ is stabilized within a few hours after the start of sputtering, while the change of discharge impedance appears after several days.

The change of discharge impedance can be controlled by preliminarily coating the inner walls of the film-forming chamber 315, including portions to which the $SiO_2$ film could adhere, with a material having a dielectric constant equivalent to that of the material for the film.

The present embodiment is so arranged that values of the partial pressure of residual $H_2O$ measured by the mass spectrometer 304 are subjected to feedback through the sputter power control circuit 302 to the output of sputter power, but it is also possible to stabilize the sputtering rate by feedback to the flow rate of oxygen gas.

Also, the present embodiment is so arranged that the capacitor capacitances are specified from the positions of the variable capacitor driving motors 312 and 313, the discharge impedance is calculated by the calculating circuit 303, and, based on the results, the feedback is used to adjust the output of the sputter power supply; but it is also possible to stabilize the sputtering rate by using the feedback of the calculation results of the discharge impedance to adjust the flow rate of oxygen gas.

As described, the sputtering rate can be made stable and the reproducibility can be improved by the feedback operation to the sputtering power or to the throughput of sputter gas, based on values of the partial pressure of residual $H_2O$ gas or the discharge impedance, as described above.

Embodiment 4

Figure 6:
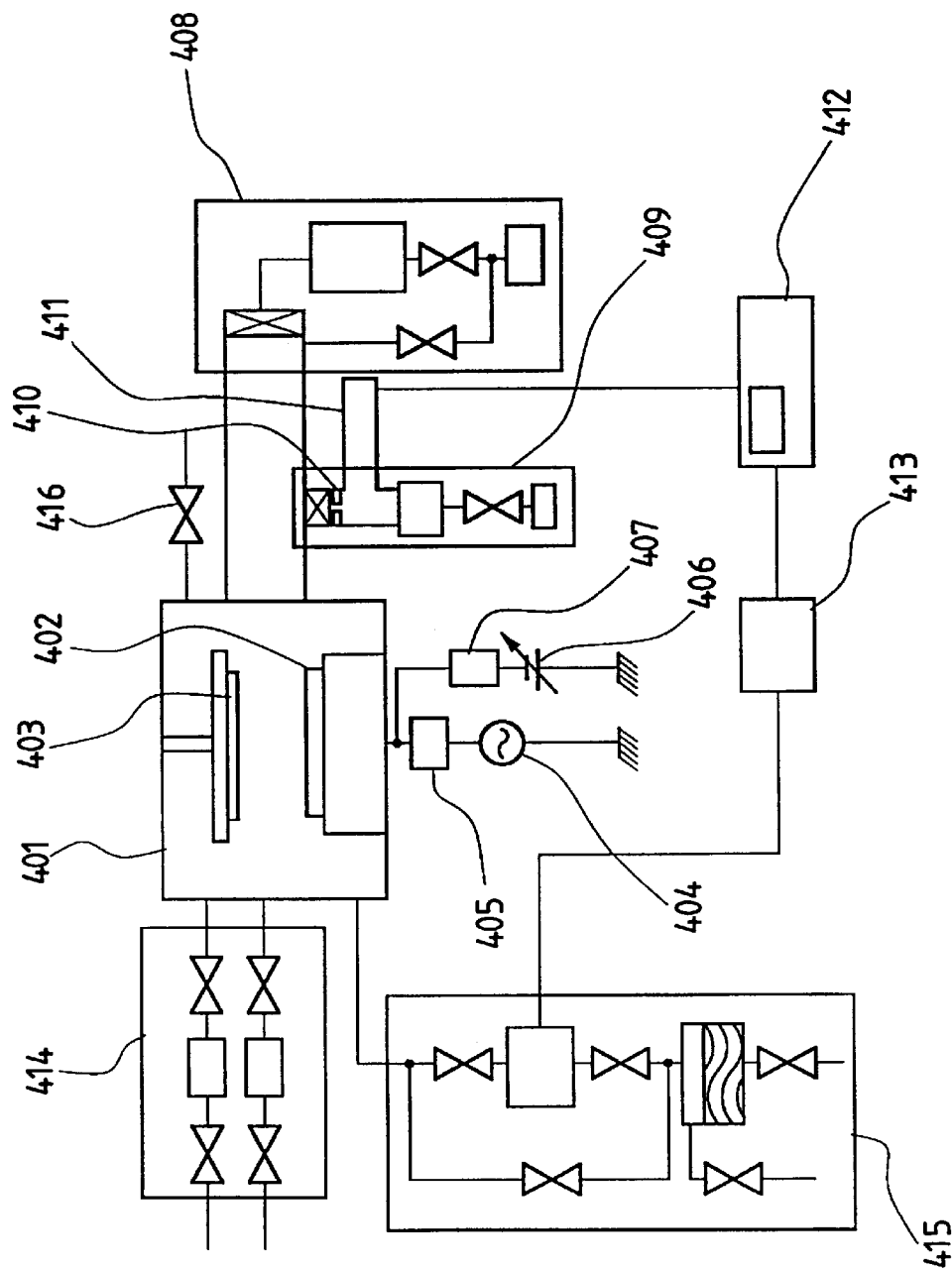
FIG. 6 is a block diagram of a sputtering apparatus according to the fourth embodiment of the present invention.

FIG. 6 is a block diagram to show the structure of a sputtering apparatus according to the fourth embodiment of the present invention. In FIG. 6, reference numeral 401 designates a vacuum chamber (chamber), 402 a target, 403 a substrate on which a thin film is to be formed, 404 a high-frequency supply connected to the target 402 to apply a high-frequency voltage to the target 402, 405 a matching unit, 406 a dc power source connected in parallel with the high-frequency supply 404 to apply a dc voltage to the target 402, 407 a low-pass filter for cutting high-frequency waves, and 408 a vacuum evacuation system for reducing the pressure inside the vacuum chamber 401. The target 402 is the cathode and the substrate 403 is normally kept at the ground potential. The target 402 may be selecting from the group consisting of metals, alloys, inorganic oxides, nitrides, carbides, fluorides, etc. Permanent magnets or electromagnets are provided as magnetic field applying means on the back side of target 402, so that a paralleled magnetic field is applied to the target 402. The vacuum evacuation system 408 is composed of a turbo molecular pump for main evacuation, a roughing rotary pump, a main valve, a roughing valve, an auxiliary valve, etc.

Numeral 409 denotes a differential exhaust system of a quadrupole mass filter for measuring the partial pressure of $H_2O$ in the vacuum chamber 401, having the same structure as the vacuum evacuation system 408. Numeral 410 designates an orifice set between the vacuum chamber 401 and the differential exhaust system 409 to produce a differential pressure between them. The orifice 410 is a hole or a variable valve having such a size as to allow about one to two orders of the differential pressure between the vacuum chamber 401 and the differential exhaust system 409.

Numeral 411 denotes a sensor unit for the quadrupole mass filter, 412 a main body of the quadrupole mass filter, 413 a water control circuit for controlling the supply of water into the vacuum chamber 401, based on an output from the quadrupole mass filter main body 412. The reference numeral 414 designates a sputter gas supply system for supplying the sputter gas into the vacuum chamber 401, and 415 designates a water supply system for supplying water stored in a temperature-controlled reservoir into the vacuum chamber 401, based on a control signal from the water control circuit 413. The water supply system 415 is composed of a water tank, a mass flow controller, a stop valve, a bypass valve, etc. Numeral 416 is a leak valve for effecting the air leak of the vacuum chamber 1.

Next described is the operation (action) of the apparatus. A substrate 403 to be processed is first set and the vacuum chamber is evacuated by the vacuum evacuation system 408 to a desired pressure. On this occasion the main valve in the differential exhaust system 409 is closed to effect sufficient evacuation and baking, so that the released gas is in a fully suppressed state from the walls of the differential exhaust system 409 and the quadrupole mass filter sensor unit 411. When the pressure inside the vacuum chamber 401 is reduced to about $1 \times 10^{-4}$ Pa, the main valve in the differential exhaust system 409 is opened and the partial pressure of $H_2O$ inside the vacuum chamber 401 is measured by the quadrupole mass filter. In this case, the gas through the orifice 410 is measured. Experimental values demonstrated that the partial pressure of $H_2O$ of mass number 18 was $2 \times 10^{-5}$ Pa and the partial pressure of OH of mass number 17 was $7 \times 10^{-6}$ Pa.

Next, in order to keep the partial pressure of water in the vacuum chamber 401 constant, such a value that the water partial pressure inside the differential exhaust system 409 becomes a certain specific value (specifically, the $H_2O$ partial pressure becomes $4 \times 10^{-5}$ Pa in this experiment) is set for the control circuit 413. A measured value of the $H_2O$ partial pressure measured by the quadrupole mass filter is output as an analog signal proportional to the value of $H_2O$ partial pressure from the quadrupole mass filter main body 412 to be supplied to the control circuit 413. The control circuit 413 compares the input value with the set value and outputs a control signal (to make the input value closer to the set value) to the water supply system 415. The water supply system 415 supplies water proportional to the control signal into the vacuum chamber 401. This control loop maintains the $H_2O$ partial pressure in the vacuum chamber 401 constant.

The temperature in the temperature-controlled reservoir is controlled to maintain 50° C. The temperature regulator used for the temperature control, and the control circuit 413 are most preferably those of the control method of continuous outputs under the PID control.

While the $H_2O$ partial pressure in the vacuum chamber 401 is controlled at a specific value, the sputter gas is introduced from the sputter gas supply system 414 into the vacuum chamber 401. The sputter gas is inactive gas such as argon. In case of reactive sputtering, the sputter gas may include reactive gas such as oxygen, nitrogen, methane, etc. The degree of vacuum in the vacuum chamber 401 is preferably $1 \times 10^{-1}$ to 1 Pa after introduction of a constant amount of the sputter gas into the vacuum chamber.

The dc voltage is then applied to the target 402. The voltage application to the target 402 may be such that the dc voltage is applied to the target, such that both the high-frequency voltage and the dc voltage are superimposedly applied to the target, or such that only the high-frequency voltage is applied to the target. Glow discharge occurs when the voltage is thus applied to the target 402. The glow discharge produces plasma in the discharge space. Positive ions in the plasma are accelerated because of a voltage drop near the target 402 so as to collide with the surface of target 402, to sputter-evaporate the surface of target 402. The thus sputtered film-forming material is deposited on the substrate 403 to form a thin film thereon.

Table 1 shows film-forming rates and refractive indices of formed films for wavelength 400 nm against values of water ($H_2O$) partial pressure ($H_2O$ partial pressure in the differential exhaust system 9) where $SiO_2$ films and $Al_2O_3$ films were formed in the above manner. The $SiO_2$ films were formed with an $SiO_2$ target and the $Al_2O_3$ films with an Al target, both in a gaseous mixture of argon and oxygen. As the $H_2O$ partial pressure in sputtering is low, the film-forming rate is fast for either an $SiO_2$ film or an $Al_2O_3$ film, while the refractive index indicating the quality of the film tends to decrease for $SiO_2$ films but increase for $Al_2O_3$ films. The characteristic values indicated in Table 1 are values obtained when the three values indicated in Table 1 were employed as the setting value for controlling the $H_2O$ partial pressure as set in the control circuit 413. In the conventional case, when the $H_2O$ partial pressure is not controlled, the film-forming rate and the quality of film change with the evacuation and film-forming time, as shown in Table 1.

TABLE 1

| | | $SiO_2$ film | | $Al_2O_3$ film | |
| --- | --- | --- | --- | --- | --- |
| $H_2O$ partial pressure (Pa) | $H_2O$ input amount (SCCM) | Refractive index = n | Forming rate (nm/sec) | Refractive index = n | Forming rate (nm/sec) |
| $1 \times 10^{-4}$ | 0.50 | 1.48 | 0.35 | 1.63 | 0.09 |
| $5 \times 10^{-5}$ | 0.25 | 1.46 | 0.37 | 1.69 | 0.10 |
| $1 \times 10^{-5}$ | 0.00 | 1.45 | 0.40 | 1.72 | 0.11 |

Embodiment 5

The sputtering apparatus in the fourth embodiment was modified in such a manner that the partial pressure of OH of mass number 17 could be measured as a gas species to be measured in the vacuum chamber 1, which showed the same effects under the same loop control as in the fourth embodiment.

Embodiment 6 and Comparative Examples 1 to 3

Figure 7:
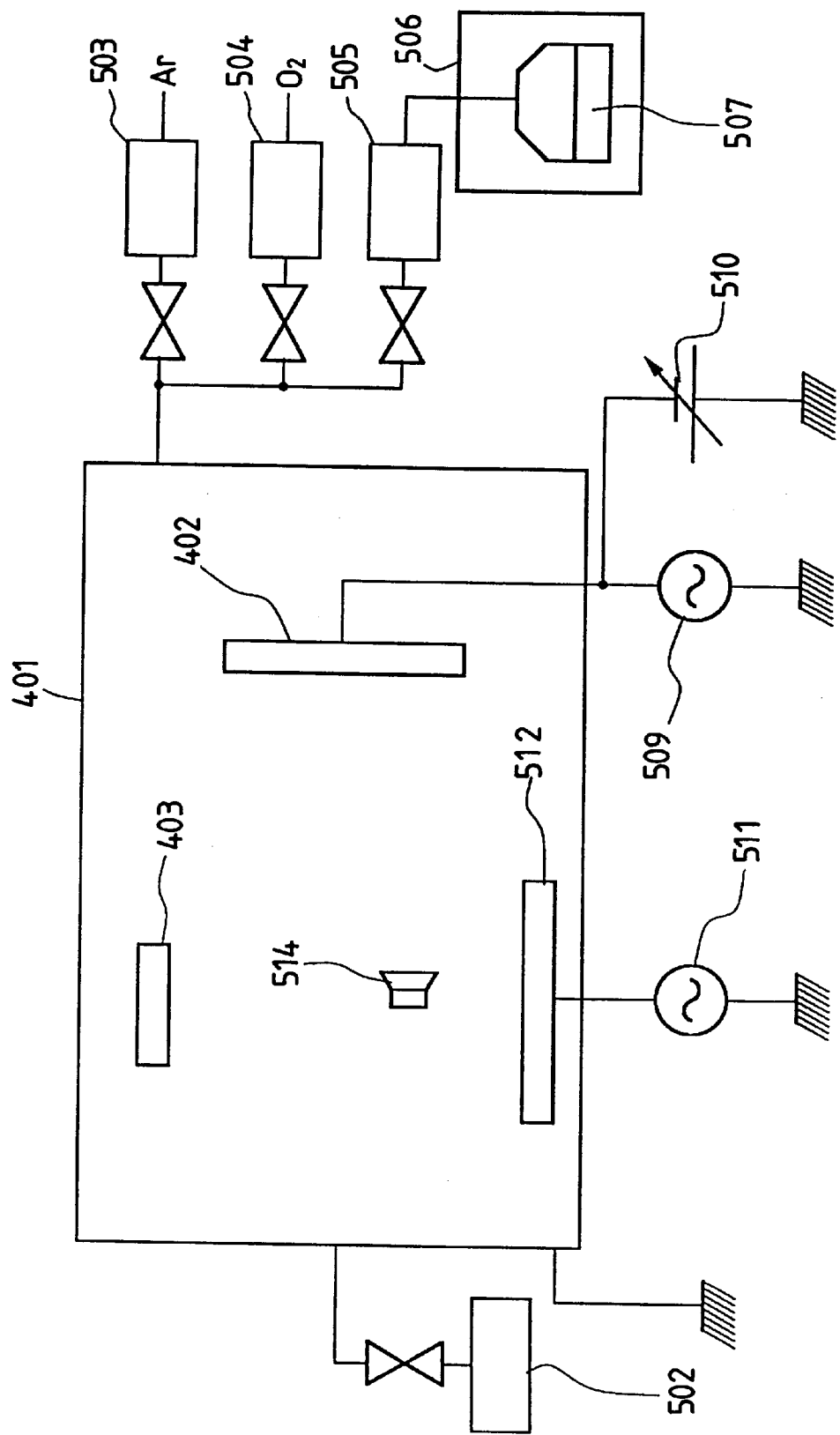
FIG. 7 is a block diagram of an oxide thin-film forming apparatus according to the fifth embodiment of the present invention.

FIG. 7 is a block diagram to diagrammatically show an oxide thin-film forming apparatus according to the sixth embodiment of the present invention. As shown in FIG. 7, the apparatus is so arranged that a vacuum chamber 401 is kept in vacuum by a vacuum pump 502 and that Ar and $O_2$ are introduced through gas flow meters 503 and 504, respectively, into the vacuum chamber 401. Also, $H_2O$ 507 is evaporated in a temperature-controlled reservoir 506 kept at about 50° C., and the $H_2O$ vapor is similarly introduced through a flow meter 505. The present embodiment is arranged to produce a thin film by the sputtering method, in which a target 402, as material for the thin film, is set in the vacuum chamber 401 and power is supplied from an RF generator 509 that outputs high-frequency waves (hereinafter referred to as RF) of 13.56 MHz and from a dc supply 510. Further, a discharge electrode 512, to which power of VHF generator 511 is applied, is set in parallel with the substrate 403 rotatable about its own axis in the vacuum chamber 401 and perpendicular to the target 402. A quartz oscillator thickness meter 514 is used for control of the thickness of the thin film.

Using this apparatus, a thin film of $Al_2O_3$ was produced with aluminum as the material for target 402 and discharge electrode 512 and with synthetic quartz glass as the material for substrate 403. The vacuum chamber 401 was first evacuated to a vacuum of about $10^{-5}$ Pa (pascal) by the vacuum pump 502, and thereafter $O_2$ was introduced at 150 sccm through the flow meter 504. Further, $H_2O$ was introduced at 0.25 sccm through the flow meter 505 to maintain the overall pressure at about 0.13 Pa. After the gas flow was stabilized, the RF power of 500 W and the dc power of 1560 W (260 V, 6.0 A) were applied to the target 402 to cause discharge, and the VHF power of 100 W was further applied to the discharge electrode 512. The thickness of the film on the substrate 403 was indirectly monitored by the quartz oscillator thickness meter 514 before it reached about 160 nm, thus forming an $Al_2O_3$ film. Then the transmittance and reflectivity of the film were measured by the spectrophotometric method, and optical absorption of the film was calculated from measured values thereof to obtain an extinction coefficient. Since the present embodiment was directed to production of an anti-reflection film against KrF laser, the measurement wavelength was 248 nm. The result is shown as example 6 in Table 2.

TABLE 2

| | Introduction of $H_2O$ | Application of VHF | Extinction Coefficient (E-3) |
|---|---|---|---|
| Example 6 | Yes | Yes | 0.0 |
| Comparative example 1 | Yes | No | 5.6 |
| Comparative example 2 | No | Yes | 6.8 |
| Comparative example 3 | No | No | 5.4 |

Also, $Al_2O_3$ films were similarly formed under such conditions that the application of VHF power was omitted from the above conditions, that $H_2O$ was not introduced, and that neither the application of VHF power nor the introduction of $H_2O$ was utilized, obtaining extinction coefficients for the respective cases. The results are shown as comparative examples 1 thru 3 in Table 2.

It is seen from Table 2 that the optical absorption can be overcome only in the case of example 6 employing both the introduction of $H_2O$ and the application of VHF power.

Embodiment 7

Alternately depositing $Al_2O_3$ films obtainable in the above manner, and $SiO_2$ films without absorption obtainable in the same manner, in six layers a total of on a synthetic quartz substrate, an anti-reflection film was produced that was effective to shut light of two wavelengths, i.e., the wavelength 248 nm of KrF laser and the wavelength 633 nm of He-Ne laser. Table 3 shows the structure of the film together with refractive indices and optical thicknesses of the respective layers.

TABLE 3

| | Material | Refractive index (n) | Optical thickness (nd) |
|---|---|---|---|
| Entrance-side medium | air | 1.00 | |
| 1st layer | $SiO_2$ | 1.51 | 66.1 |
| 2nd layer | $Al_2O_3$ | 1.75 | 47.4 |
| 3rd layer | $SiO_2$ | 1.51 | 62.6 |
| 4th layer | $Al_2O_3$ | 1.75 | 186.9 |
| 5th layer | $SiO_2$ | 1.51 | 101.7 |
| 6th layer | $Al_2O_3$ | 1.75 | 90.6 |
| Exit-side medium (substrate) | quartz | 1.51 | |

Figure 8:
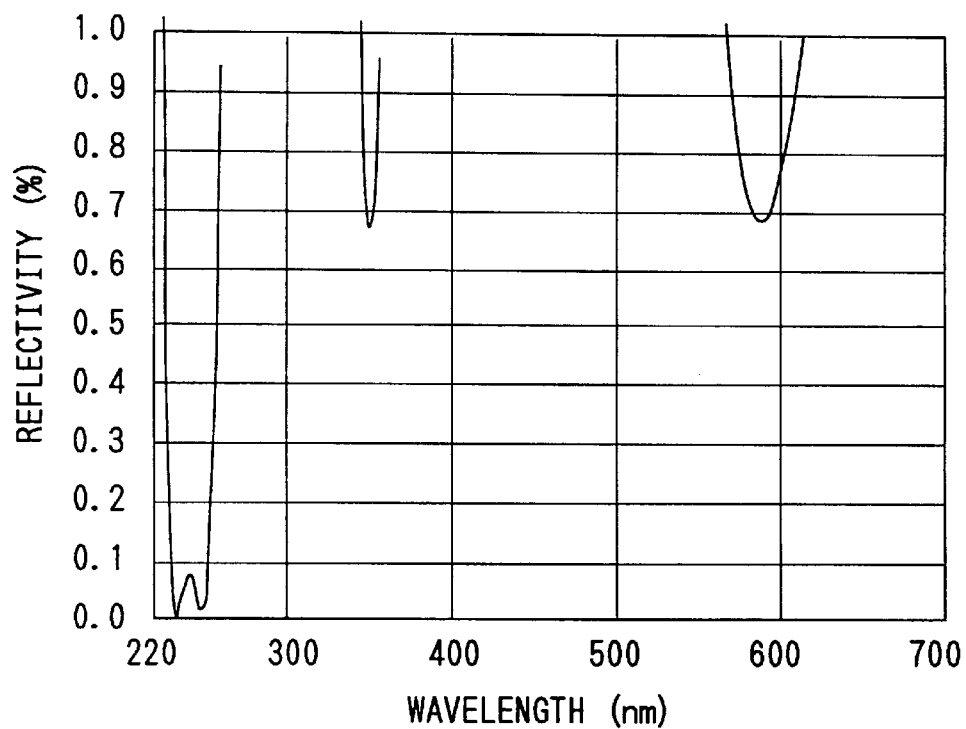
FIG. 8 is a graph showing reflection characteristics of an anti-reflection film formed in the sixth embodiment of the present invention.
Figure 9:
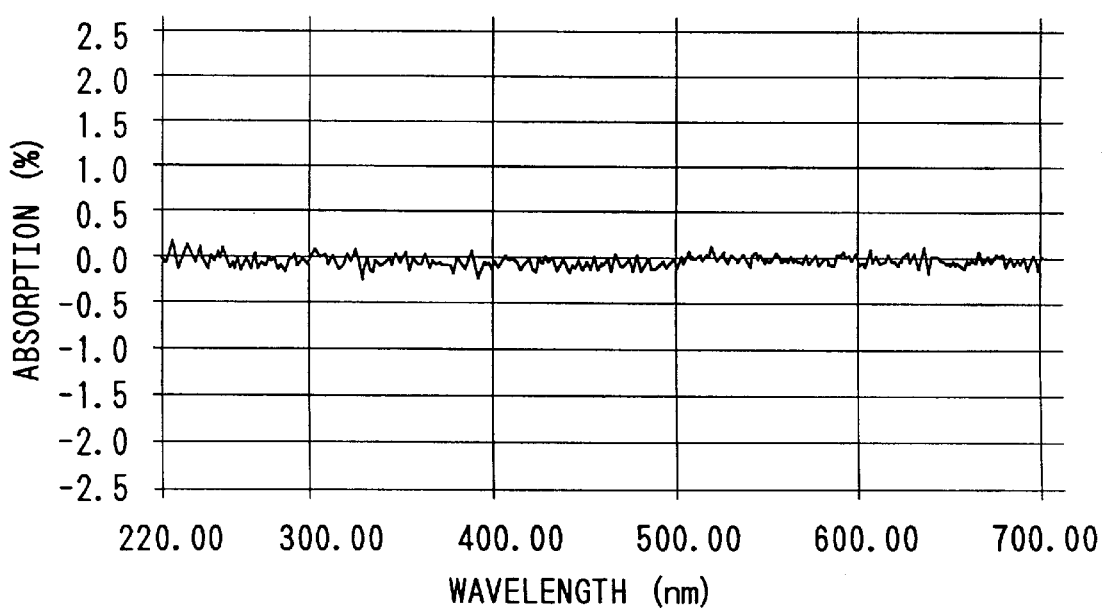
FIG. 9 is a graph showing absorption characteristics of the anti-reflection film of FIG. 8.

Also, FIG. 8 shows reflection characteristics of the anti-reflection film. Further, FIG. 9 shows absorption characteristics of the anti-reflection film. As seen from FIG. 9, the obtained film was excellent, without absorption over the broad wavelength range of from 220 nm to 700 nm.

Embodiment 8 and Comparative Examples 4 to 6

Thin films of $HfO_2$ were formed in the same manner as in example 6 and comparative examples 1 to 3 except that the material for target 402 and discharge electrode 512 was hafnium, and extinction coefficients thereof were obtained. The results are shown as example 8 and comparative examples 4 to 6 in Table 4.

TABLE 4

| | Introduction of $H_2O$ | Application of VHF | Extinction Coefficient (E-3) |
|---|---|---|---|
| Example 8 | Yes | Yes | 0.0 |
| Comparative example 4 | Yes | No | 7.2 |
| Comparative example 5 | No | Yes | 7.1 |
| Comparative example 6 | No | No | 7.5 |

It is seen from Table 4 that the optical absorption can be overcome only in the case of example 8 employing both the introduction of $H_2O$ and the application of VHF power.

Example 9 and Comparative Examples 7 to 9

Thin films of $ZrO_2$ were formed in the same manner as in example 6 and comparative examples 1 to 3, except that the material for target 402 and the discharge electrode 512 was zirconium and that the measurement wavelength was 365 nm, and extinction coefficients thereof were obtained. The results are shown as example 9 and comparative examples 7 to 9 in Table 5. The reason why the measurement wavelength was 365 nm is that the $ZrO_2$ thin film was intended to be used at the wavelength 365 nm of the i-line.

TABLE 5

| | Introduction of $H_2O$ | Application of VHF | Extinction Coefficient (E-3) |
|---|---|---|---|
| Example 9 | Yes | Yes | 0.0 |
| Comparative example 7 | Yes | No | 3.2 |

TABLE 5-continued

|  | Introduction of $H_2O$ | Application of VHF | Extinction Coefficient (E-3) |
|---|---|---|---|
| Comparative example 8 | No | Yes | 3.8 |
| Comparative example 9 | No | No | 4.5 |

It is seen from Table 5 that the optical absorption can be overcome only in the case of example 9 employing both the introduction of $H_2O$ and the application of VHF power.

Embodiment 10 and Comparative Examples 10 to 12

Thin films of $Y_2O_3$ were formed in the same manner as in example 9, and comparative examples 7 to 9 except that the material for target 402 and discharge electrode 512 was yttrium. Results are shown as example 10 and comparative examples 10 to 12 in Table 6.

TABLE 6

|  | Introduction of $H_2O$ | Application of VHF | Extinction Coefficient (E-3) |
|---|---|---|---|
| Example 10 | Yes | Yes | 0.0 |
| Comparative example 10 | Yes | No | 2.5 |
| Comparative example 11 | No | Yes | 2.2 |
| Comparative example 12 | No | No | 4.1 |

It is seen from Table 6 that the optical absorption can be overcome only in the case of example 10 employing both the introduction of $H_2O$ and the application of VHF power.

Also, the optical absorption can be overcome by films of $Ta_2O_5$ and $TiO_2$ employing both the introduction of $H_2O$ and the application of VHF power.

Embodiment 11 and Comparative Example 13

Next described is an embodiment in which a thin film is uniformly formed on a substrate having curvature, utilizing the feature that the plasma spreads in a broad range when the VHf power is applied. The substrate 403 was either one of two convex lenses and two concave lenses each having a curvature and an outer diameter as listed in Table 7. Also, thin films were formed in the same manner as in example 6, except that $H_2O$ was not introduced, in order to check only the effects of plasma spread. A distribution of thicknesses was measured for each film formed in the lens surface. Results are shown as example 11 in Table 7.

Further, thin films were formed in the same manner as example 11, except that the VHF power was not applied, and a distribution of thicknesses was measured for each film. Results are shown as comparative example 13 in Table 7.

TABLE 7

| Substrate convex or concave | Curvature (mm) | Outer diameter (mm) | Example 11 (w VHF) t distr (%) | Comparative Example 13 (w/o VHF) t distr (%) |
|---|---|---|---|---|
| Convex | 500 | 300 | 0.0 | 2.3 |
| Convex | 50 | 150 | 0.3 | 5.0 |
| Concave | 400 | 300 | 0.1 | 2.2 |
| Concave | 50 | 150 | 0.5 | 4.4 |

It is seen from Table 7 that the application of VHF power can improve the thickness distribution amounts in the cases of any shapes of substrate 3.

What is claimed is:

1. A method for forming a multi-layer optical thin film on a substrate, said method comprising the steps of:

selecting a target material as a sputtering object from a plurality of target materials, to sequentially form each layer of a plurality of optical thin layers on said substrate to form a multi-layer optical thin film on said substrate;

controlling cessation of sputtering of each selected target material by selecting a film forming time for each layer of said multi-layer optical thin film to be formed, in order to obtain a desired thickness for each layer;

measuring a characteristic of said multi-layer optical thin film formed on said substrate after sputtering is completed to obtain a measurement;

calculating an actual thickness of each layer based on the measurement; and changing said film forming time for forming a next multi-layer optical thin film on a next substrate when the actual thickness of each layer of said multi-layer optical thin film layer formed on said substrate differs from the desired thickness.

2. A method according to claim 1, wherein said multi-layer optical thin film is formed as a reflection-preventing film and wherein the measured characteristic of said multi-layer optical thin film is reflection.

3. A method for forming a multi-layer optical thin film on a substrate, said method comprising the steps of:

selecting a target material as a sputtering object from a plurality of target materials, to sequentially form each layer of a plurality of optical thin layers on said substrate to form a multi-layer optical thin film on said substrate;

controlling cessation of sputtering of each selected target material by selecting a film forming time for each layer of said multi-layer optical thin film to be formed in order to obtain a desired optical characteristic and thickness;

measuring a characteristic of each optical thin film formed on said substrate to obtain a measurement; and changing said desired thickness of each layer of optical thin film to be sequentially formed based on said measurement to obtain the desired optical characteristic of said multi-layer optical thin film.

4. A method according to claim 3, wherein said step of changing said desired thickness includes a step for calculating an actual thickness of each layer of optical thin film to be sequentially formed to obtain said desired optical characteristic of said multi-layer optical thin film as a result of said measuring.

* * * * *

UNITED STATES PATENT AND TRADEMARK OFFICE
CERTIFICATE OF CORRECTION

PATENT NO.  : 5,911,856
DATED       : June 15, 1999
INVENTOR(S) : YASUYUKI SUZUKI, ET AL.          Page 1 of 5

It is certified that error appears in the above-identified patent and that said Letters Patent is hereby corrected as shown below:

On title, item

[56] REFERENCES CITED

U.S. PATENT DOCUMENTS

"Tison et al." should read --Tisone et al.--.

AT [57] ABSTRACT

Line 7, "aimed" should read --desired--.

IN THE DRAWINGS

Sheet 3, FIG. 3, "PREQENCY" should read --FREQUENCY--.

COLUMN 1

Line 15, "films" should read --films,--;
Line 23, "carried out" should be deleted and "change" should read --any change--;
Line 63, "inline" should read --in-line--; "etc." should read --etc.,--; and "prechamber" should read --pre-chamber--.

COLUMN 2

Line 25, "substrate." should read --substrate:--;
Line 49, "above described" should read --above-described--; and
Line 60, "experienced" should read --experienced,--.

UNITED STATES PATENT AND TRADEMARK OFFICE
CERTIFICATE OF CORRECTION

PATENT NO. : 5,911,856
DATED : June 15, 1999
INVENTOR(S) : YASUYUKI SUZUKI, ET AL.

It is certified that error appears in the above-identified patent and that said Letters Patent is hereby corrected as shown below:

COLUMN 3

Line 3, "changes" should read --changes,--;
    Line 6, "self bias" should read --self-bias--;
    Line 11, "film-forming" should read
--the film-forming--;
    Line 12, "in" (first occurrence) should be deleted;
    Line 27, "thus measured" should read --thus-measured--;
    Line 29, "desired" should read --desired,--;
    Line 33, "thickness setting" should read
--thickness-setting--;
    Line 47, "thus measured" should read --thus-measured--; and
    Line 67, "film such" should read --film, such--.

COLUMN 4

Line 2, "the" (first occurrence) should be deleted;
    Line 27, "thus measured" should read --thus-measured--;
    Line 36, "quality" should read --quality,--;
    Line 47, "affects" should read --effects--;
    Line 55, "abovedescribed" should read
--above-described--; and
    Line 65, "abovedescribed" should read
--above-described--.

UNITED STATES PATENT AND TRADEMARK OFFICE
CERTIFICATE OF CORRECTION

PATENT NO. : 5,911,856
DATED : June 15, 1999
INVENTOR(S) : YASUYUKI SUZUKI, ET AL.

It is certified that error appears in the above-identified patent and that said Letters Patent is hereby corrected as shown below:

COLUMN 5

Line 6, "technology." should read --the technology.--.

COLUMN 7

Line 51, "the a" should read --for the--.

COLUMN 8

Line 3, "waste" should read --wasteful--;
    Line 30, "now" should be deleted; and
    Line 35, "a" should be deleted.

COLUMN 9

Line 46, "hydrogens" should read --hydrogen,--.

COLUMN 10

Line 48, "selecting" should read --selected--; and
    Line 52, "paralleled" should read --parallel--.

COLUMN 11

Line 14, "chamber 1." should read --chamber 401.--.

UNITED STATES PATENT AND TRADEMARK OFFICE
CERTIFICATE OF CORRECTION

PATENT NO.   : 5,911,856
DATED        : June 15, 1999
INVENTOR(S)  : YASUYUKI SUZUKI, ET AL.

It is certified that error appears in the above-identified patent and that said Letters Patent is hereby corrected as shown below:

COLUMN 12

Line 6, "target 402" should read --target 402,--;
    Line 7, "402," should read --402--; and
    Line 45, "chamber 1," should read --chamber 401,--.

COLUMN 13

Line 60, "six layers a total of" should read --a total of six layers--; and
    Line 64, "film" should read --film,--.

COLUMN 14

Line 26, "3" should read --3,--;
    Line 48, "Example 9" should read --Embodiment 9--; and
    Line 53, "zirconium" should read --zirconium,--.

COLUMN 15

Line 22, "9 except" should read --9, except--; and
    Line 54, "VHf" should read --VHF--.

UNITED STATES PATENT AND TRADEMARK OFFICE
CERTIFICATE OF CORRECTION

PATENT NO. : 5,911,856
DATED : June 15, 1999
INVENTOR(S) : YASUYUKI SUZUKI, ET AL.

It is certified that error appears in the above-identified patent and that said Letters Patent is hereby corrected as shown below:

COLUMN 16

Line 15, "substrate 3." should read --substrate 403--.

Signed and Sealed this

Twenty-first Day of March, 2000

Attest:

Q. TODD DICKINSON

*Attesting Officer*          *Commissioner of Patents and Trademarks*